US012495650B2

(12) United States Patent
Liou et al.

(10) Patent No.: US 12,495,650 B2
(45) Date of Patent: Dec. 9, 2025

(54) TRANSPARENT DISPLAY, TRANSPARENT FILM AND TRANSPARENT DEVICE

(71) Applicant: INDUSTRIAL TECHNOLOGY RESEARCH INSTITUTE, Hsinchu (TW)

(72) Inventors: Ying-Ting Liou, Zhudong Township (TW); Ruo-Lan Chang, New Taipei (TW); Wei-Chung Chen, Kaohsiung (TW); Hao Che Kao, Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 644 days.

(21) Appl. No.: 17/886,222

(22) Filed: Aug. 11, 2022

(65) Prior Publication Data

US 2023/0317899 A1 Oct. 5, 2023

(30) Foreign Application Priority Data

Mar. 31, 2022 (TW) .................................. 111112554

(51) Int. Cl.
*H10H 20/857* (2025.01)
*H01L 25/075* (2006.01)

(52) U.S. Cl.
CPC ....... *H10H 20/857* (2025.01); *H01L 25/0753* (2013.01)

(58) Field of Classification Search
CPC ............ H10H 20/813; H10H 20/8132; H10H 20/818; H10H 20/819; H10H 20/857;
(Continued)

(56) References Cited

U.S. PATENT DOCUMENTS

| 10,928,853 B2 | 2/2021 | Tsai et al. |
| RE48,793 E | 10/2021 | Kim |

(Continued)

FOREIGN PATENT DOCUMENTS

| CN | 109407380 A | 3/2019 |
| CN | 111276055 A | 6/2020 |

(Continued)

OTHER PUBLICATIONS

TW Office Action in Application No. 111112554 Dated Mar. 9, 2023.

*Primary Examiner* — Natalia A Gondarenko
(74) *Attorney, Agent, or Firm* — Maschoff Brennan

(57) ABSTRACT

This disclosure relates to a transparent display that includes a transparent substrate, a plurality of wires, and a plurality of electronic components. The wires are disposed on the transparent substrate, and the wires have at least one serpentine part having a first end and a second end that are opposite to each other. There is an extending path formed from the first end to the second end. The electronic components are disposed on the plurality of wires. The wires have at least one part that surrounds an opening area and has a total extending length. The at least one part of the wires includes the at least one serpentine part. A ratio of a sum in length of the at least one serpentine part along the extending path to the total extending length is equal to or greater than 10%.

19 Claims, 14 Drawing Sheets

(58) Field of Classification Search
CPC ...... H10H 29/142; H10H 29/20; H10H 29/24; H10H 29/34; H10H 29/49; H10H 29/012; H10H 29/0362; H10H 29/0363; H10H 29/30; H10H 29/32; H10H 29/352; H10H 29/37; H10H 29/39; H10H 29/41; H10H 29/832; H10H 29/8323; H10H 29/852; H10H 29/953; H01L 25/0753; H01L 25/167; H10K 77/10; H10K 77/111; H10K 59/10; H10K 59/124; H10K 59/126; H10K 59/13; H10K 59/131; H10K 59/30; H10K 59/35; H10K 59/353; H10K 59/40; H10K 59/60; H10K 59/65; H10K 59/8051; H10K 59/8052; H10K 59/82; H10K 59/87; H10K 59/871; H10K 59/8722; H10K 59/873; H10K 59/8731; H10K 2102/311; G09G 3/3233; G09G 2300/0842
USPC ..................................................... 257/91, 72
See application file for complete search history.

(56) References Cited

U.S. PATENT DOCUMENTS

| | | |
|---|---|---|
| 11,372,295 B2 | 6/2022 | Cao |
| 2017/0005077 A1 | 1/2017 | Kim et al. |
| 2021/0064167 A1* | 3/2021 | Hsu .......................... G06F 1/182 |
| 2021/0408173 A1* | 12/2021 | Zhang .................... H10K 59/65 |
| 2022/0310743 A1 | 9/2022 | Yi et al. |
| 2023/0320144 A1* | 10/2023 | Cai ....................... H10K 50/822 |

FOREIGN PATENT DOCUMENTS

| | | |
|---|---|---|
| CN | 111584748 A | 8/2020 |
| CN | 112258439 A | 1/2021 |
| CN | 112103329 B | 2/2021 |
| TW | I516799 B | 1/2016 |
| TW | I549291 B | 9/2016 |
| WO | 2020208704 A1 | 10/2020 |

* cited by examiner

TRANSPARENT DISPLAY, TRANSPARENT FILM AND TRANSPARENT DEVICE

CROSS-REFERENCE TO RELATED APPLICATIONS

This non-provisional application claims priority under 35 U.S.C. § 119(a) on Patent Application No(s). 111112554 filed in Taiwan, R.O.C. on Mar. 31, 2022, the entire contents of which are hereby incorporated by reference.

TECHNICAL FIELD

The present disclosure relates to a transparent display, a transparent film, and a transparent device.

BACKGROUND

As the applications to the fields such as augmented reality (AR) and mixed reality (MR) developed quickly, a display device that is able to combine an actual scene and a digital image, such as transparent display, is more popular in the market than ever.

However, there are many electronic components arranged in the transparent display with gaps therebetween. These gaps may cause slit diffraction when light emitted from the actual scene passes through the transparent display, such that light spots or superimposition would be generated on the combined image, leading the final image indistinct.

SUMMARY

According to one aspect of the present disclosure, a transparent display includes a transparent substrate, a plurality of wires, and a plurality of electronic components. The plurality of wires are disposed on the transparent substrate, and the plurality of wires have at least one serpentine part having a first end and a second end that are opposite to each other. There is an extending path formed from the first end to the second end. The plurality of electronic components are disposed on the plurality of wires. The plurality of wires have at least one part that surrounds an opening area and has a total extending length. The at least one part of the plurality of wires comprises the at least one serpentine part. A ratio of a sum in length of the at least one serpentine part along the extending path to the total extending length is equal to or greater than 10%.

According to another aspect of the present disclosure, a transparent film configured to be attached on a transparent display includes a transparent substrate and a plurality of wires. The plurality of wires are disposed on the transparent substrate, and the plurality of wires have at least one serpentine part. The plurality of wires have at least one part forming an opening area, and the at least one part of the plurality of wires comprises the at least one serpentine part. The opening area is configured to be aligned with a light transmittable area of the transparent display, and the at least one serpentine part is configured to at least partially located on an edge of the light transmittable area.

According to still another aspect of the present disclosure, a transparent device includes a transparent display and a transparent film disposed on the transparent display. The transparent display includes a first transparent substrate, a plurality of first wires, and a plurality of electronic components. The plurality of first wires are disposed on the first transparent substrate, and the plurality of first wires have at least one part that surrounds a light transmittable area and has a total extending length. The plurality of electronic components are disposed on the plurality of first wires. The transparent film includes a second transparent substrate and a plurality of second wires. The plurality of second wires are disposed on the second transparent substrate, and the plurality of second wires have at least one serpentine part having a first end and a second end that are opposite to each other. There is an extending path formed from the first end to the second end, and the at least one serpentine part is at least partially overlapped with the at least one part of the plurality of first wires and located on an edge of the light transmittable area. A ratio of a sum in length of the at least one serpentine part along the extending path to the total extending length is equal to or greater than 10%.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
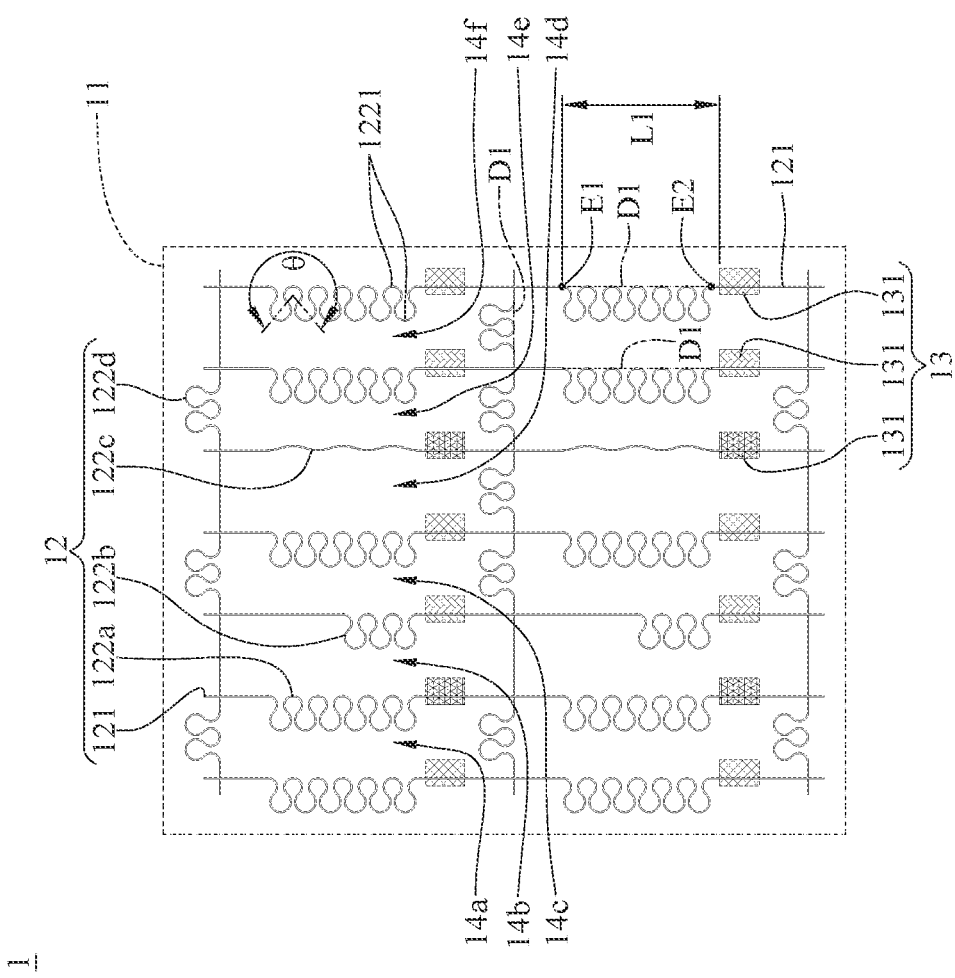
FIG. 1 is a top schematic view of a transparent display according to a first embodiment of the present disclosure.

Aspects and advantages of the invention will become apparent from the following detailed descriptions with the accompanying drawings. For purposes of explanation, one or more embodiments are given to provide a thorough understanding of the invention, and which are described in sufficient detail to enable one skilled in the art to practice the described embodiments. It should be understood that the following descriptions are not intended to limit the embodiments to one specific embodiment. On the contrary, it is intended to cover alternatives, modifications, and equivalents as can be included within the spirit and scope of the described embodiments as defined by the appended claims.

A transparent display provided in one embodiment of the present disclosure includes a transparent substrate, a plurality of wires, and a plurality of electronic components.

The wires are disposed on the transparent substrate. The wires may include a plurality of connection parts and at least one serpentine part. The connection parts may be gate lines or data lines. The quantity of the serpentine part may be plural. The serpentine parts may be connected to the connection parts, and the material of the serpentine parts may contain metal material such as silver and aluminum, alloy material such as nickel-titanium alloy and copper-zinc alloy, or non-metallic conductive material such as conductive rubber and conductive silicone. The electronic components are disposed on the wires and may be electrically connected to the wires, and the electronic components may include one or more among light emitting elements such as micro light emitting diodes (micro-LEDs), organic light emitting diodes (OLEDs), and mini-light-emitting diodes (mini-LEDs), thin-film transistors (TFTs), image sensors, and gate array chips.

In the case of the electronic components including the light emitting elements, each light emitting element may be a monochromatic subpixel, and each serpentine part can be located between any two light emitting elements. Please be noted that the light emitting elements illustrated in the drawings are shown in three patterns for referring monochromatic subpixels of three colors of red, green, and blue. However, the present disclosure is not limited thereto. In some other embodiments of the present disclosure, one light emitting element may be a pixel or a pixel group that is able to emit polychromatic light.

The areas where the wires and the electronic components are not disposed can be defined as a plurality of opening areas surrounded by the wires, and at least one serpentine part can be located on an edge of the opening areas. It can be considered that the wires have at least one part forming the opening areas, and the at least one part of the wires surrounding the opening areas includes at least one serpentine part. The serpentine part arranged on the edge of the light-transmittable opening areas can lead the opening areas to in fact have different contours. When light passes through the inconsistent opening areas of different contours, diffraction can thus be reduced, such that the image to be presented can be accurately displayed by the transparent display. Please be noted that in some other embodiments, the transparent display may further include a plurality of transparent organic light emitting diodes disposed in the opening areas.

Shapes of the opening areas may be substantially polygonal, the connection parts may be straight lines, and the overall travelling path of each serpentine part may be substantially defined as a straight line. Alternatively, shapes of the opening areas may be substantially circular or oval, the connection parts may be arc lines, and the overall travelling path of each serpentine part may be substantially defined to extend along the extending direction of one connection part adjacent thereto. Each serpentine part can be defined to have a first end and a second end that are opposite to each other, and there is an extending path formed from the first end to the second end; the serpentine part extends on the extending path in a left-and-right-curved manner, and the extending path and the connection parts can substantially form an outline of a polygon, a circle, or an oval. Please refer to FIG. 1, which shows a rectangular opening area substantially constituted by straight extending paths D1 denoted by dotted lines and connection parts 121 according to the first embodiment of the present disclosure. Please refer to FIG. 2, which shows a circular opening area substantially constituted by arced extending paths D2 denoted by dotted lines and connection parts 221 according to the second embodiment of the present disclosure. Moreover, the shapes of two adjacent opening areas substantially constituted by the extending paths and the connection parts may be different. When light passes through the inconsistent opening areas of different shapes, diffraction can be further reduced. Please be noted that the serpentine parts asymmetrically extending with respect to the extending paths in the drawings are not intended to restrict the present disclosure; in some other embodiments, the serpentine parts may symmetrically extend with respect to the extending path.

The more detail of the serpentine part will be illustrated hereinafter. The serpentine part can be defined to have at least one curved part. In the case that the serpentine part includes a plurality of curved parts, two adjacent curved parts can be defined to have curvature radii with different signs; that is, one curved part may have positive curvature radius, while the other one curved part adjacent thereto may have negative curvature radius. As such, the serpentine part can reduce diffraction by its sufficiently turned configuration. Moreover, each curved part may have a curved angle ranging from 40 degrees to 280 degrees. Accordingly, the serpentine part can have the abovementioned left-and-right-curved shape. Moreover, the curved angle of each curved part may be 80 degrees, 120 degrees, 220 degrees, etc. Please refer to FIG. 1, which shows a curved angle θ of a curved part 1221 of a serpentine part according to the first embodiment of the present disclosure. In the case that the quantities of the serpentine part and the curved part of each serpentine part are plural, the curved angles of the curved parts of one serpentine part may be the same, and the curved angles of the curved parts of two adjacent serpentine parts may be different. Therefore, the inconsistency of the edges of adjacent opening areas can be increased, such that diffraction caused by light passing through the opening areas can be further reduced. Please be noted that the serpentine parts illustrated by smooth and curved lines in the drawings are not intended to restrict the present disclosure. In some other embodiments, the serpentine parts may be constituted by many extremely short straight lines. Further, the curved parts of one serpentine part may have the same or different curved angles depending on the actual requirements.

A ratio of a sum in length of all serpentine parts along the extending paths to the total extending length of the wires is equal to or greater than 10%. A ratio of a sum of a length from the first end to the second end of each of the serpentine parts along its respective extending path to a sum of a length from one end to the other end of each of the connection parts and the length from the first end to the second end of each of the serpentine parts along its respective extending path is equal to or greater than 10%. Therefore, it is favorable for providing a structure able to reduce diffraction. Moreover, ratios of a length from the first end to the second end of each of two adjacent serpentine parts along its respective extending path to the sum of the length from one end to the other end of each of the connection parts and the length from the first end to the second end of each of the serpentine parts along its respective extending path among the wires may be different. Accordingly, the inconsistency of the edges of adjacent opening areas can be further increased, such that diffraction caused by light passing through the opening areas can be further reduced. Please refer to FIG. 1, which shows a length L1 from the first end E1 to the second end E2 of one serpentine part along the straight extending path D1 according to the first embodiment of the present disclosure, and a sum of side lengths of the rectangular opening area substantially constituted by the extending paths D1 and the connection parts 121 is the total extending length of the wires forming the rectangular opening area. Please refer to FIG. 2, which shows a length L2 from the first end E1 to the second end E2 of one serpentine part along the arced extending path D2 extending along an arced extending direction of one connection part 221 adjacent thereto according to the second embodiment of the present disclosure, and a sum of side lengths of the circular opening area substantially constituted by the extending paths D2 and the connection parts 221 is the total extending length of the wires forming the circular opening area. Moreover, the abovementioned ratio may be 16%, 30%, 50%, 66%, or 100%. Please be noted that if the abovementioned ratio is 100%, the wires do not include any connection part; that is, all wires are constituted by curved serpentine parts.

In one embodiment, the serpentine parts may have flexibility. In detail, the strain of the serpentine parts within the yield strength range may be 1% to 15%. The transparent substrate may also have flexibility. As such, the transparent display can have flexibility under the cooperation of the flexible transparent substrate and the flexible serpentine parts collaborated with the opening area. Therefore, the transparent display can be applied to a non-planar object such as a car window, a mobile vehicle and a smart interactive device.

A transparent film provided in another embodiment of the present disclosure can be attached on a transparent display without any serpentine wire. The transparent film includes a transparent substrate and a plurality of wires. The wires are disposed on the transparent substrate. The wires have at least one serpentine part. The wires form a plurality of opening areas, and the at least one serpentine part is located on an edge of the opening area. The opening area is configured to be aligned with a light transmittable area of the transparent display, and an orthogonal projection of the at least one serpentine part onto the transparent display is configured to at least partially located on an edge of the light transmittable area. As such, when light passing through the transparent display without any serpentine wire and the transparent film with the serpentine part, diffraction can be reduced, and therefore the image to be presented can be accurately displayed by the transparent display. Please be noted that the present disclosure is not limited to whether the wires of the transparent film have conductivity.

A transparent device provided in further another embodiment of the present disclosure includes a transparent display and a transparent film. The transparent display includes a first transparent substrate, a plurality of first wires, and a plurality of electronic components. The first wires are disposed on the first transparent substrate. The first wires surround a plurality of light transmittable areas. The electronic components are disposed on the first wires. The transparent film can be attached on the transparent display. The transparent film includes a second transparent substrate and a plurality of second wires. The second wires are disposed on the second transparent substrate. The second wires have at least one serpentine part. The serpentine part has a first end and a second end that are opposite to each other, and there is an extending path formed from the first end to the second end. An orthogonal projection of the serpentine part onto the transparent display is at least partially overlapped with first wires and located on an edge of the light transmittable areas. Further, the first wires surrounding the light transmittable areas have a total extending length, and a ratio of a sum in length of the serpentine part along the extending path to the total extending length is equal to or greater than 10%.

According to the present disclosure, the aforementioned features and conditions can be utilized in numerous combinations so as to achieve corresponding effects.

According to the above description of the present disclosure, the following embodiments are provided for further explanation.

FIRST EMBODIMENT

Please refer to FIG. 1, which is a top schematic view of a transparent display according to a first embodiment of the present disclosure.

In this embodiment, the transparent display 1 includes a transparent substrate 11, a plurality of wires 12, and a plurality of electronic components 13. The wires 12 can have conductivity, and the wires 12 are disposed on the transparent substrate 11. The wires 12 includes a plurality of connection parts 121 and a plurality of serpentine parts 122a-122d that are connected to each other. The electronic components 13 are disposed on and electrically connected to the connection parts 121 of the wires 12. The electronic components 13 includes a plurality of light emitting elements 131 that can be monochromatic subpixels, and each of the serpentine parts 122a-122d may be located between two light emitting elements 131.

The connection parts 121, the serpentine parts 122a-122d, and the electronic components 13 can surround a plurality of opening areas, such as opening areas 14a-14f, and at least one of the serpentine parts 122a-122d is located on an edge of each of the opening areas 14a-14f.

The shapes of the opening areas 14a-14f are substantially rectangular, the connection parts 121 are straight lines, and the extending paths of the serpentine parts 122a-122d are substantially along horizontal or vertical straight directions on which the serpentine parts 122a-122d extend in a left-and-right-curved manner. The connection parts 121 and the extending paths of the serpentine parts 122a-122d substantially form the outline of the rectangle. Moreover, the opening areas 14a-14f can be substantially rectangular with a similar shape.

The more detail of the serpentine parts 122a-122d will be illustrated hereinafter. The serpentine parts 122a-122d each have at least one curved part 1221. In the case that the serpentine parts 122a-122d each include a plurality of curved parts (as shown in FIG. 1), the curved angle of each curved part 1221 may range from 40 degrees to 280 degrees. In the contours of the opening areas 14a-14c and 14f, the curved angles of the curved parts 1221 among two adjacent vertical serpentine parts 122a and 122b may be the same. In the contours of the opening areas 14d-14e, the curved angles of the curved parts 1221 among two vertical serpentine parts 122a and 122c may be different. The curved angles of the curved parts 1221 of the serpentine part 122c between the opening areas 14d and 14e are less than the curved angles of the curved parts 1221 of the other serpentine parts 122a, 122b, and 122d.

A ratio of a sum of a length from one end to the other end among each of the serpentine parts 122a-122d along its respective extending path to a sum of a length from one end to the other end among each of the connection parts 121 and the length from one end to the other end among each of the serpentine parts 122a-122d along its respective extending path is equal to or greater than 10%. In detail, in the contours of the opening areas 14a and 14d-14f, ratios of the length from one end to the other end among each of two vertical serpentine parts 122a and 122c along its respective extending path to a sum of the length from one end to the other end among each of the connection parts 121 and the length from one end to the other end among each of the serpentine parts 122a, 122c, and 122d along its respective extending path are the same. In the contours of the opening areas 14b-14c, ratios of the length from one end to the other end among each of two adjacent vertical serpentine parts 122a and 122b along its respective extending path to a sum of the length from one end to the other end among each of the connection parts 121 and the length form one end to the other end among each of the serpentine parts 122a, 122b, and 122d along its respective extending path are different. The length from one end to the other end of the vertical serpentine part 122b between the opening areas 14b and 14c along its respective extending path is less than the length from one end to the other end among each of the other vertical serpentine parts 122a and 122c along its respective extending path.

SECOND EMBODIMENT

Figure 2:
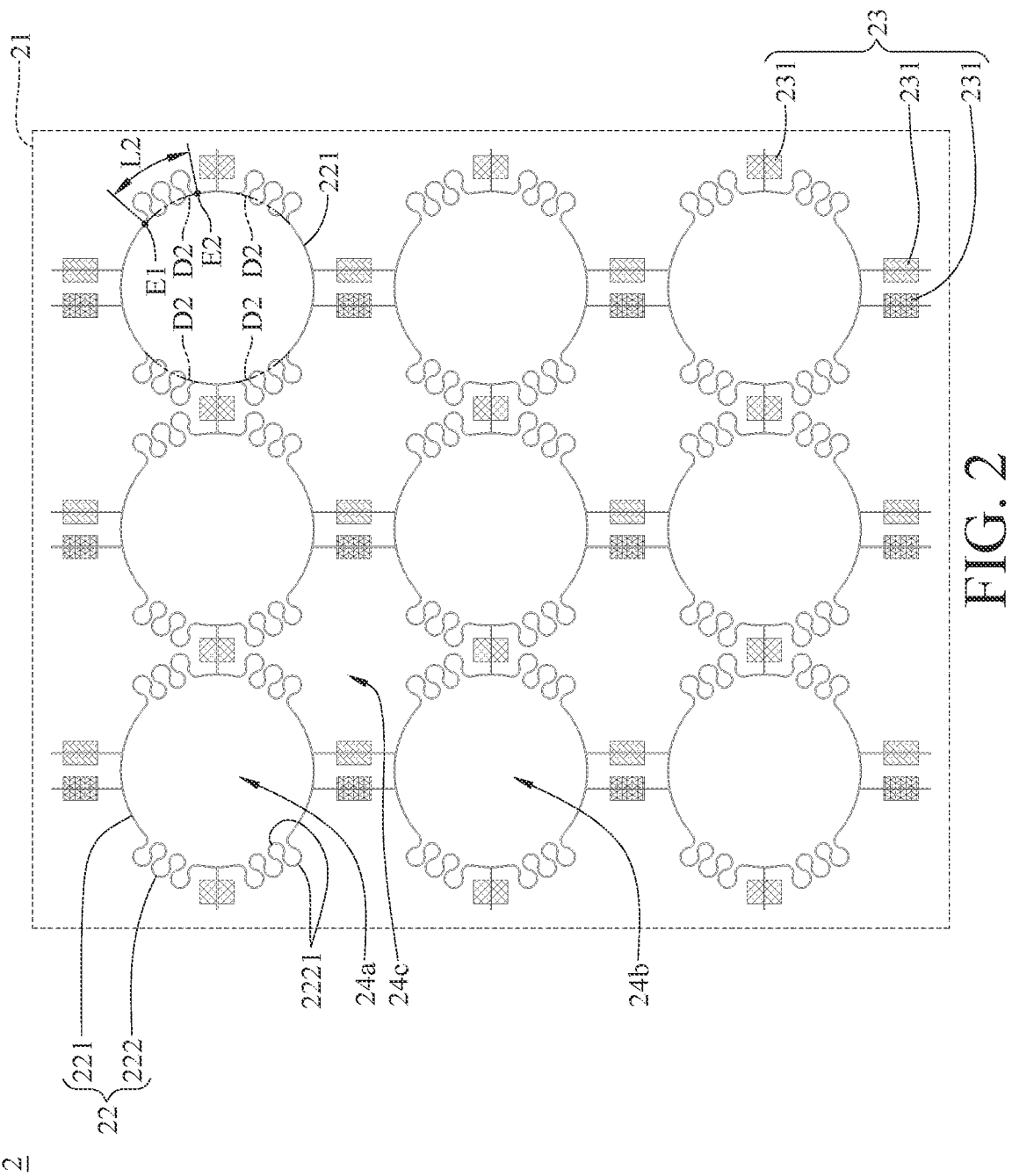
FIG. 2 is a top schematic view of a transparent display according to a second embodiment of the present disclosure.

Please refer to FIG. 2, which is a top schematic view of a transparent display according to a second embodiment of the present disclosure.

In this embodiment, the transparent display 2 includes a transparent substrate 21, a plurality of wires 22, and a plurality of electronic components 23. The wires 22 can have conductivity, and the wires 22 are disposed on the transparent substrate 21. The wires 22 includes a plurality of connection parts 221 and a plurality of serpentine parts 222 that are connected to each other. The electronic components 23 are disposed on and electrically connected to the connection parts 221 of the wires 22. The electronic components 23 includes a plurality of light emitting elements 231 that can be monochromatic subpixels, and each of the serpentine parts 222 may be located between two light emitting elements 231.

The connection parts 221 and the serpentine parts 222 can surround a plurality of opening areas, such as opening areas 24a-24c, and at least one of the serpentine parts 222 is located on an edge of each of the opening areas 24a-24c.

The shapes of the opening areas 24a and 24b are substantially circular, the opening area 24c is irregularly shaped, the connection parts 221 are smooth arc lines, and the extending paths of the serpentine parts 222 are substantially along extending directions of connection parts 221 adjacent thereto on which the serpentine parts 222 extend in a left-and-right-curved manner. The connection parts 221 and the extending paths of the serpentine parts 222 substantially form the outline of the circle or the irregular shape. Moreover, the opening areas 24a and 24b can be substantially circular with a similar shape which is different from the irregular shape of the opening area 24c.

The more detail of the serpentine parts 222 will be illustrated hereinafter. The serpentine parts 222 each have at least one curved part 2221. In the case that the serpentine parts 222 each include a plurality of curved parts (as shown in FIG. 2), the curved angle of each curved part 2221 may range from 40 degrees to 280 degrees. The curved angles of the curved parts 2221 among one serpentine part 222 may be the same. In the contours of the opening areas 24a-24c, the curved angles of the curved parts 2221 among two adjacent serpentine parts 222 may be the same.

A ratio of a sum of a length from one end to the other end among each of the serpentine parts 222 along its respective extending path to a sum of a length from one end to the other end among each of the connection parts 221 and the length from one end to the other end among each of the serpentine parts 222 along its respective extending path is equal to or greater than 10%. In detail, in the contours of the opening areas 24a-24c, ratios of the length from one end to the other end among each of two adjacent serpentine parts 222 along its respective extending path to a sum of the length from one end to the other end among each of the connection parts 221 and the length from one end to the other end among each of the serpentine parts 222 along its respective extending path are the same.

THIRD EMBODIMENT

Figure 3:
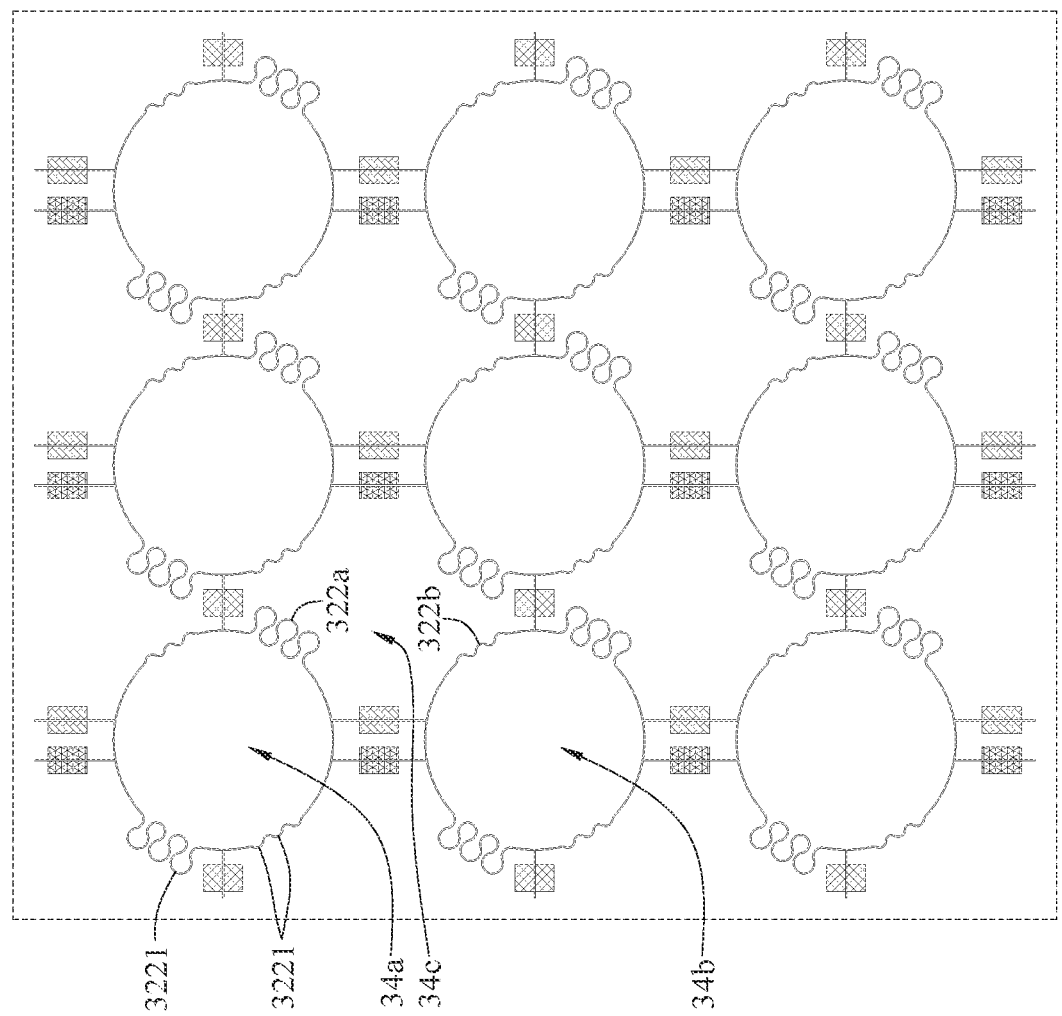
FIG. 3 is a top schematic view of a transparent display according to a third embodiment of the present disclosure.

Please refer to FIG. 3, which is a top schematic view of a transparent display according to a third embodiment of the present disclosure. A transparent display 3 disclosed in this embodiment is similar to the transparent display 2 disclosed in the second embodiment. In this embodiment, the curved angles of the curved parts 3221 among serpentine parts 322a and 322b may be different. The curved angles of the curved parts 3221 of the serpentine part 322b between the opening areas 34b and 34c are less than the curved angles of the curved parts 3221 of the serpentine part 322a between the opening areas 34a and 34c.

FOURTH EMBODIMENT

Figure 4:
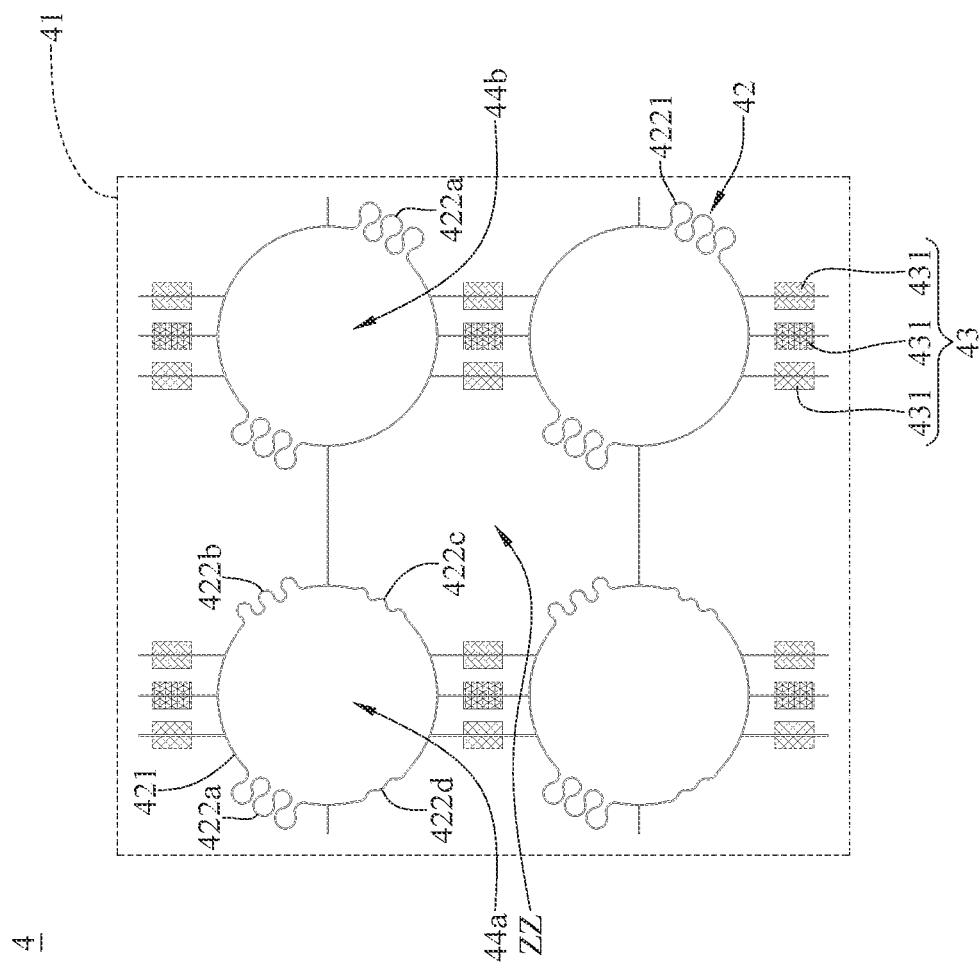
FIG. 4 is a top schematic view of a transparent display according to a fourth embodiment of the present disclosure.

Please refer to FIG. 4, which is a top schematic view of a transparent display according to a fourth embodiment of the present disclosure.

In this embodiment, the transparent display 4 includes a transparent substrate 41, a plurality of wires 42, and a plurality of electronic components 43. The wires 42 can have conductivity, and the wires 42 are disposed on the transparent substrate 41. The wires 42 includes a plurality of connection parts 421 and a plurality of serpentine parts 422a-422d that are connected to each other. The electronic components 43 are disposed on and electrically connected to the connection parts 421 of the wires 42. The electronic components 43 includes a plurality of light emitting elements 431 that can be monochromatic subpixels, and each of the serpentine parts 422a-422d may be located between two light emitting elements 431.

The connection parts 421 and the serpentine parts 422a-422d can surround a plurality of opening areas, such as opening areas 44a-44b, and at least one of the serpentine parts 422a-422d is located on an edge of each of the opening areas 44a-44b.

The shapes of the opening areas 44a-44b are substantially circular, the connection parts 421 are smooth arc lines, and the extending paths of the serpentine parts 422a-422d are substantially along extending directions of connection parts 421 adjacent thereto on which the serpentine parts 422a-422d extend in a left-and-right-curved manner. The connection parts 421 and the extending paths of the serpentine parts 422a-422d substantially form the outline of the circle. Moreover, the opening areas 44a-44b can be substantially circular with a similar shape. Please be noted that a ZZ region other than the opening areas 44a-44b can be used for other electronic components (not shown) to be placed or can form additional opening area without placing any element, and the present disclosure is not limited thereto.

The more detail of the serpentine parts 422a-422d will be illustrated hereinafter. The serpentine parts 422a-422d each have at least one curved part 4221. In the case that the serpentine parts 422a-422d each include a plurality of curved parts (as shown in FIG. 4), the curved angle of each curved part 4221 may range from 40 degrees to 280 degrees. In the contours of the opening area 44a, the curved angles of the curved parts 4221 among the serpentine parts 422a-422d may be the different. In the contours of the opening area 44b, the curved angles of the curved parts 4221 among two serpentine parts 422a may be the same. The curved angles of the curved parts 4221 among the serpentine parts 422a-422d around the opening area 44a are arranged in order from largest to smallest clockwise from the serpentine part 422a.

A ratio of a sum of a length from one end to the other end among each of the serpentine parts 422a-422d along its respective extending path to a sum of a length from one end to the other end among each of the connection parts 421 and the length from one end to the other end among each of the serpentine parts 422a-422d along its respective extending path is equal to or greater than 10%. In detail, in the contours of the opening areas 44a-44b, ratios of the length from one end to the other end among each of the serpentine parts 422a-422d along its respective extending path to a sum of the length from one end to the other end among each of the connection parts 421 and the length from one end to the other end among each of the serpentine parts 422a-422d along its respective extending path are the same. The extending lengths among the wires 42 around the opening areas 44a-44b are the same.

FIFTH EMBODIMENT

Figure 5:
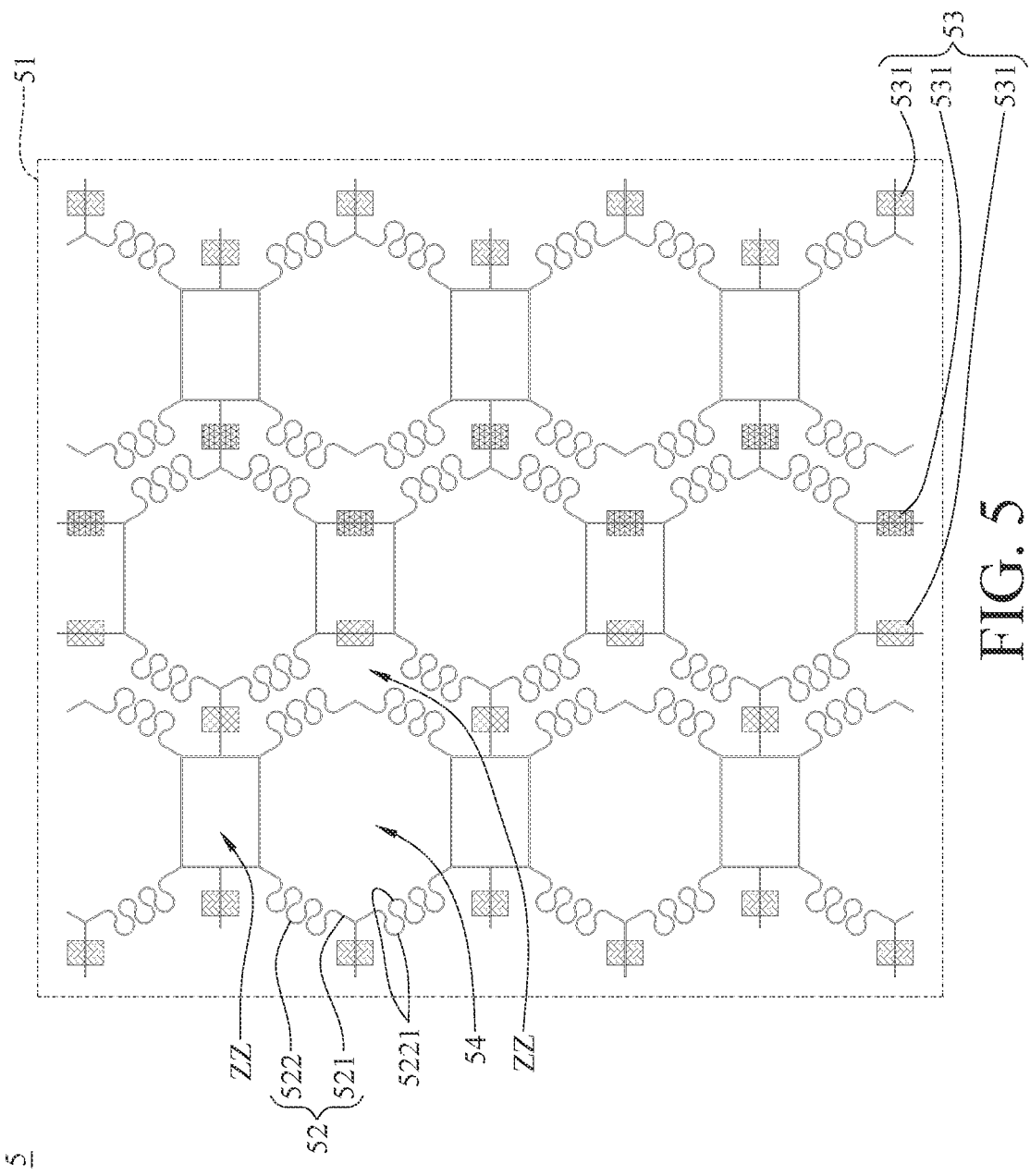
FIG. 5 is a top schematic view of a transparent display according to a fifth embodiment of the present disclosure.

Please refer to FIG. 5, which is a top schematic view of a transparent display according to a fifth embodiment of the present disclosure.

In this embodiment, the transparent display 5 includes a transparent substrate 51, a plurality of wires 52, and a plurality of electronic components 53. The wires 52 can have conductivity, and the wires 52 are disposed on the transparent substrate 51. The wires 52 includes a plurality of connection parts 521 and a plurality of serpentine parts 522 that are connected to each other. The electronic components 53 are disposed on and electrically connected to the connection parts 521 of the wires 52. The electronic components 53 includes a plurality of light emitting elements 531 that can be monochromatic subpixels or polychromatic subpixel combination emitting, for example, red light, green light, blue light, or white light, and each of the serpentine parts 522 may be located between two light emitting elements 531. In some other embodiments, there may be no serpentine part or more than one serpentine parts arranged between two electronic components 53.

The connection parts 521, the serpentine parts 522, and the electronic components 53 can surround a plurality of opening areas, such as opening areas 54, and at least one of the serpentine parts 522 is located on an edge of each of the opening areas 54.

The shapes of the opening areas 54 are substantially hexagonal, the connection parts 521 are straight lines, and the extending paths of the serpentine parts 522 are substantially along directions angled with extending directions of connection parts 521 adjacent thereto by 120 degrees on which the serpentine parts 522 extend in a left-and-right-curved manner. The connection parts 521 and the extending paths of the serpentine parts 522 substantially form the outline of the hexagon. Moreover, the opening areas 54 can be substantially hexagonal with a similar shape. Please be noted that a ZZ region other than the opening areas 54 can be used for other electronic components (not shown) to be placed or can form additional opening area without placing any element, and the present disclosure is not limited thereto.

The more detail of the serpentine parts 522 will be illustrated hereinafter. The serpentine parts 522 each have at least one curved part 5221. In the case that the serpentine parts 522 each include a plurality of curved parts (as shown in FIG. 5), the curved angle of each curved part 5221 may range from 40 degrees to 280 degrees. The curved angles of the curved parts 5221 among one serpentine part 522 may be the same. In the contours of the opening areas 54, the curved angles of the curved parts 5221 among two adjacent serpentine parts 522 may be the same.

A ratio of a sum of a length from one end to the other end among each of the serpentine parts 522 along its respective extending path to a sum of a length from one end to the other end among each of the connection parts 521 and the length from one end to the other end among each of the serpentine parts 522 along its respective extending path is equal to or greater than 10%. In detail, in the contours of the opening areas 54, ratios of the length from one end to the other end among each of two adjacent serpentine parts 522 along its respective extending path to a sum of the length from one end to the other end among each of the connection parts 521 and the length from one end to the other end among each of the serpentine parts 522 along its respective extending path are the same.

SIXTH EMBODIMENT

Figure 6:
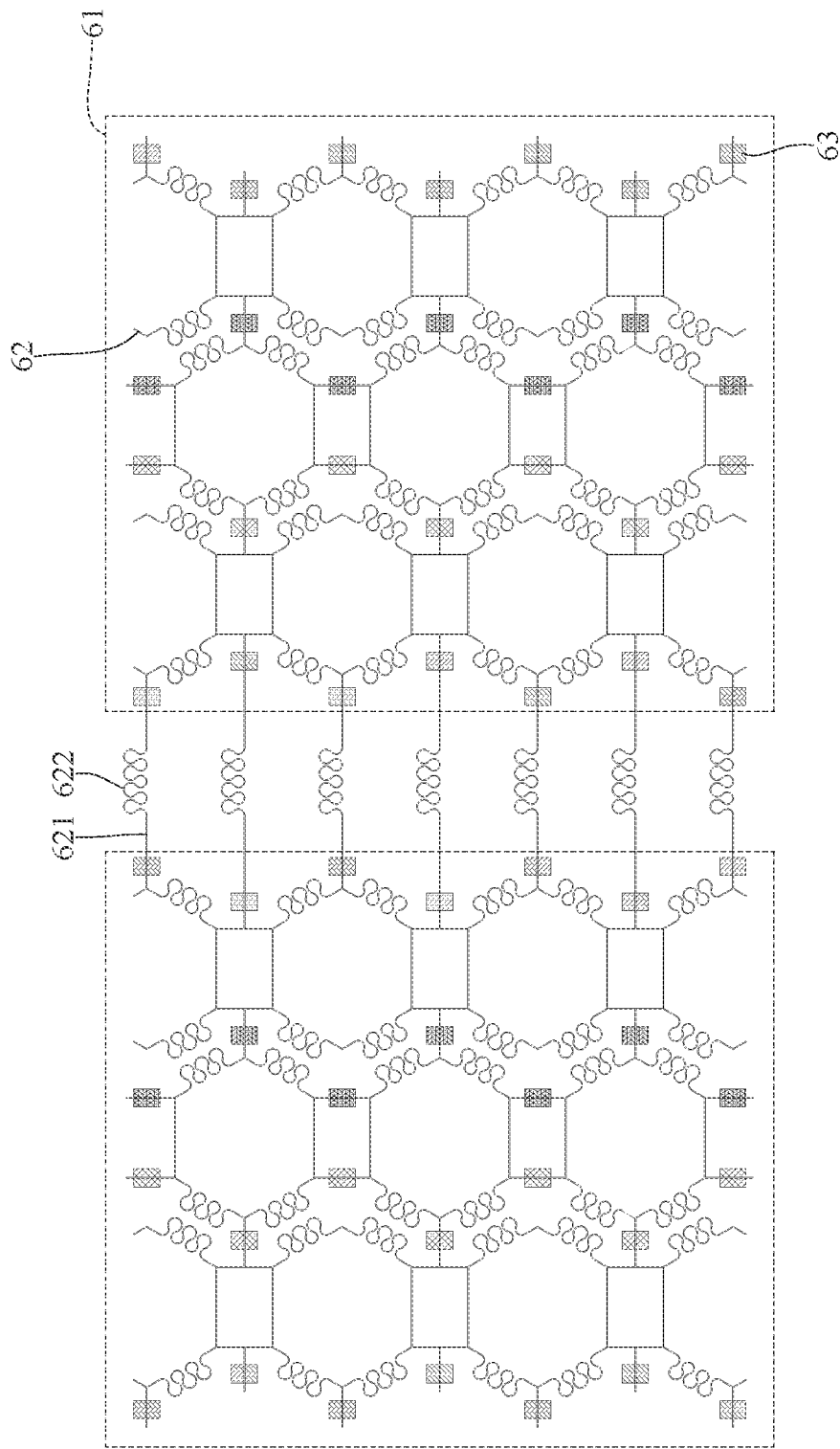
FIG. 6 is a top schematic view of a transparent display according to a sixth embodiment of the present disclosure.

Please refer to FIG. 6, which is a top schematic view of a transparent display according to a sixth embodiment of the present disclosure.

In this embodiment, a transparent display 6 includes two transparent substrates 61, a plurality of wires 62, and a plurality of electronic components 63. The arrangements of the wires 62 and the electronic components 63 on each transparent substrate 61 disclosed in this embodiment may be similar to the arrangements of the wires 52 and the electronic components 53 on the transparent substrate 51 disclosed in the fifth embodiment. In this embodiment, the connection parts 621 and the serpentine parts 622 can be further disposed between the two transparent substrates 61, and the wires 62 and the electronic components 63 on different transparent substrates 61 are connected to each other, such that the actual application of the transparent display 6 can be more various.

SEVENTH EMBODIMENT

Figure 7:
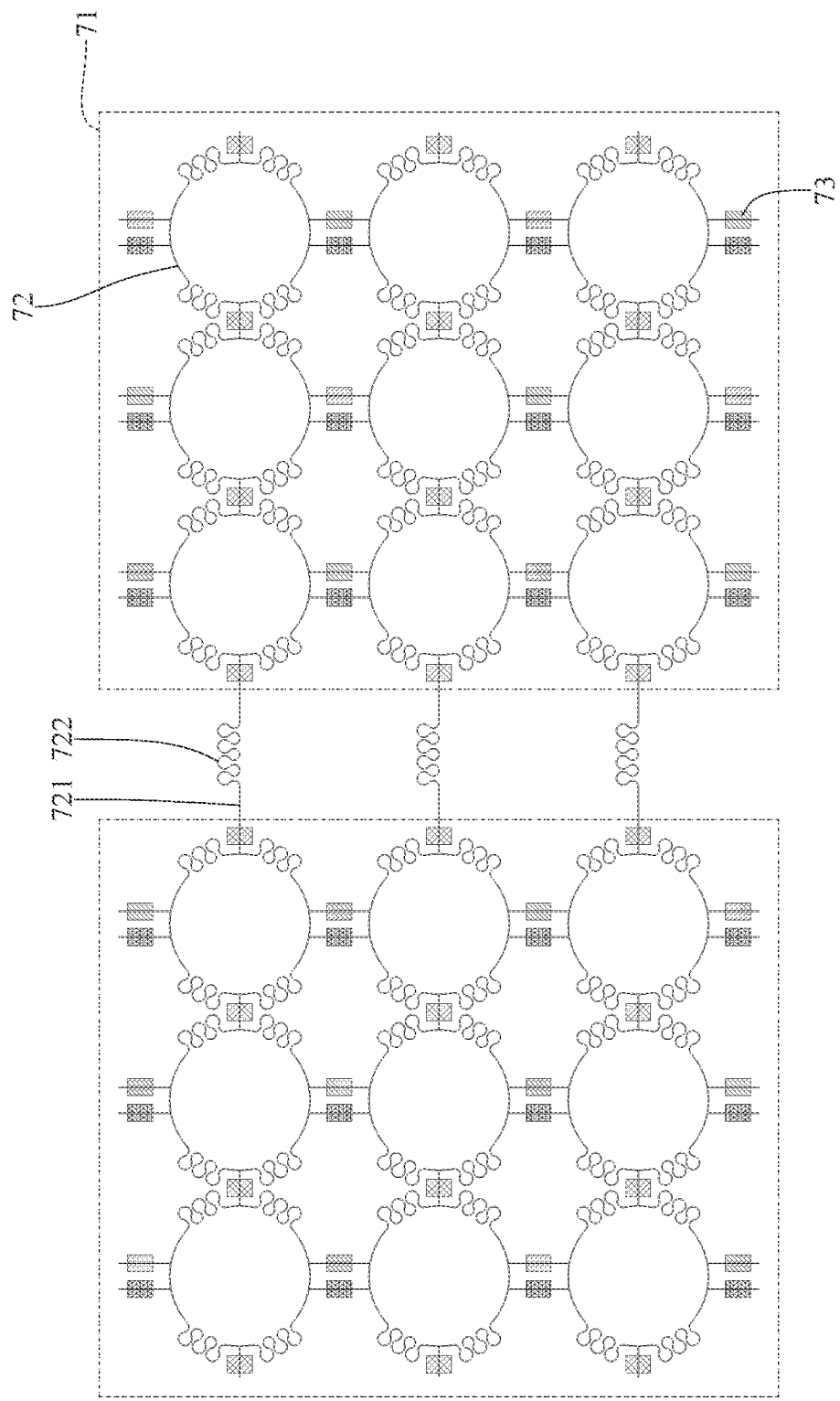
FIG. 7 is a top schematic view of a transparent display according to a seventh embodiment of the present disclosure.

Please refer to FIG. 7, which is a top schematic view of a transparent display according to a seventh embodiment of the present disclosure.

In this embodiment, a transparent display 7 includes two transparent substrates 71, a plurality of wires 72, and a plurality of electronic components 73. The arrangements of the wires 72 and the electronic components 73 on each transparent substrate 71 disclosed in this embodiment may be similar to the arrangements of the wires 22 and the electronic components 23 on the transparent substrate 21 disclosed in the second embodiment. In this embodiment, the connection parts 721 and the serpentine parts 722 can be further disposed between the two transparent substrates 71, and the wires 72 and the electronic components 73 on different transparent substrates 71 are connected to each other, such that the actual application of the transparent display 7 can be more various.

Figure 8:
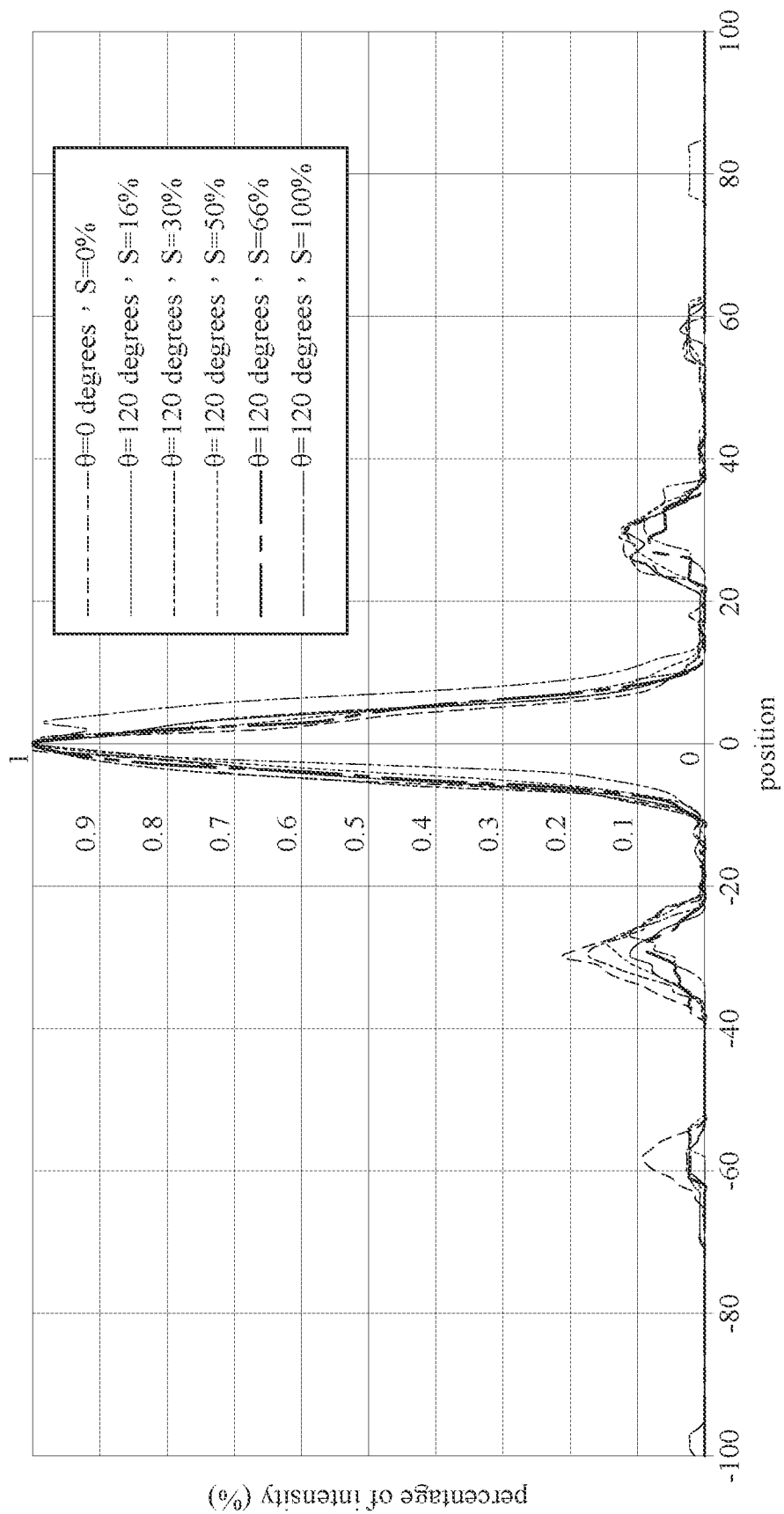
FIG. 8 is a chart showing diffraction intensities caused by light passing through transparent displays according to embodiments of the present disclosure under different ratios of serpentine parts among wires that surround rectangular opening areas.

Then, please refer to FIG. 8, which is a chart showing diffraction intensities caused by light passing through transparent displays according to embodiments of the present disclosure under different ratios of serpentine parts among wires that surround rectangular opening areas. Please be noted that for simplicity, in FIG. 8, the curved angle of the curved part of the serpentine part is represented by θ, and the ratio of the sum of the length from one end to the other end among each of the serpentine parts along its respective extending path to the sum of the length from one end to the other end among each of the connection parts and the length from one end to the other end among each of the serpentine parts along its respective extending path among the wires is represented by S. As shown in FIG. 8, the intensities of diffraction caused by light passing through the transparent displays in the case of θ maintaining 120 degrees and S being 16%, 30%, 50%, 66%, and 100% are less than that in the case of no serpentine part being provided (e.g., θ=0 degree, and S=0%), and the diffraction intensities tend to be weaker in the case of S being 30%, 50%, and 66%.

Figure 9:
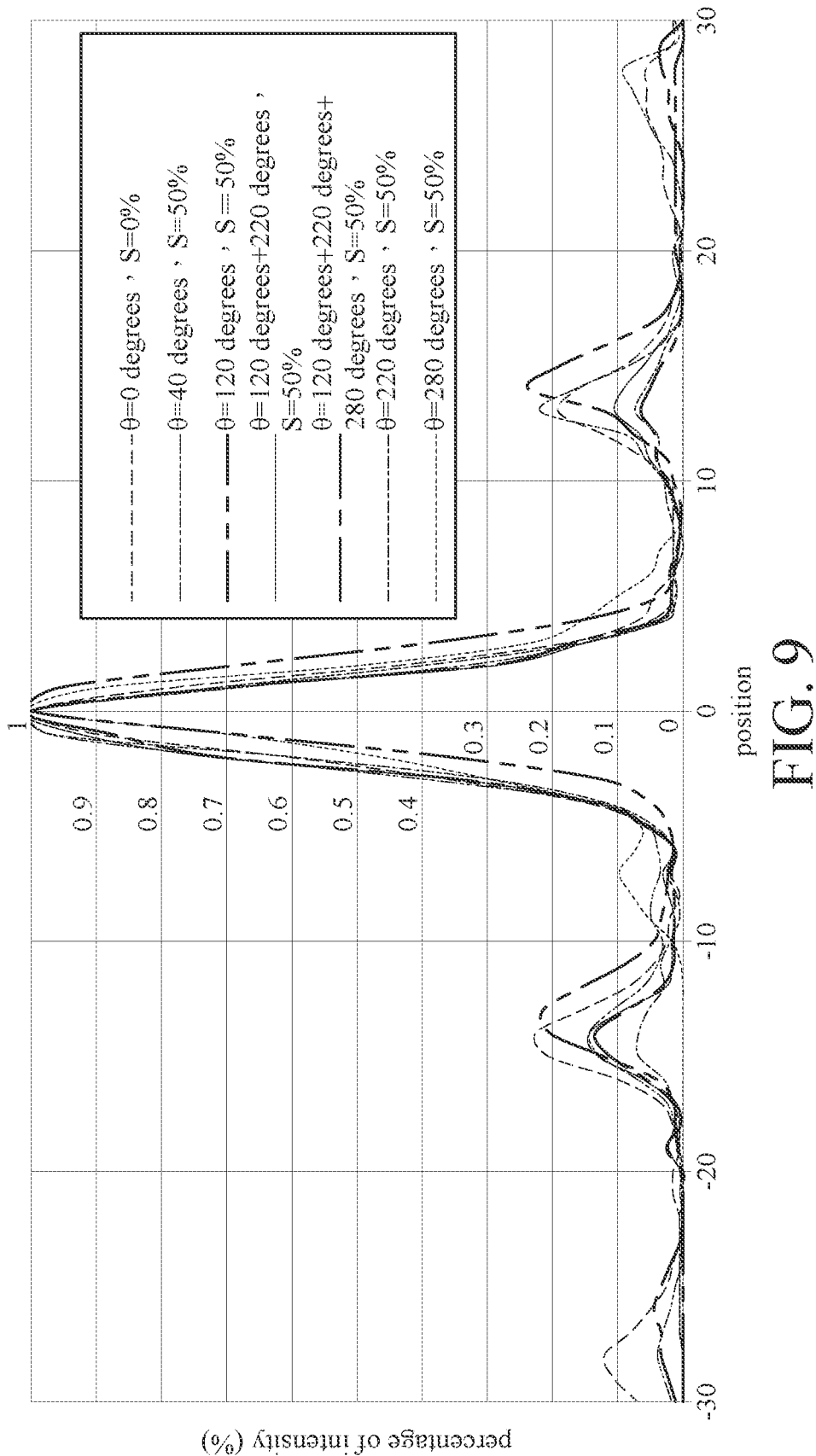
FIG. 9 is a chart showing diffraction intensities caused by light passing through transparent displays according to embodiments of the present disclosure under different curved angles of serpentine parts among wires that surround rectangular opening areas.

Then, please refer to FIG. 9, which is a chart showing diffraction intensities caused by light passing through transparent displays according to embodiments of the present disclosure under different curved angles of serpentine parts among wires that surround rectangular opening areas. Please be noted that for simplicity, in FIG. 9, the curved angle of the curved part of the serpentine part is represented by θ, and the ratio of the sum of the length from one end to the other end among each of the serpentine parts along its respective extending path to the sum of the length from one end to the other end among each of the connection parts and the length from one end to the other end among each of the serpentine parts along its respective extending path among the wires is represented by S. As shown in FIG. 9, the intensities of diffraction caused by light passing through the transparent displays in the case of S maintaining 50% and θ being 40 degrees, 120 degrees, mixture of 120 degrees and 220 degrees, mixture of 120 degrees, 220 degrees, and 280 degrees, 220 degrees, and 280 degrees are less than that in the case of no serpentine part being provided (e.g., θ=0 degree, and S=0%), and the diffraction intensities tend to be weaker in the case of θ being 120 degrees, mixture of 120 degrees and 220 degrees, mixture of 120 degrees, 220 degrees, and 280 degrees, 220 degrees, and 280 degrees.

Figure 10:
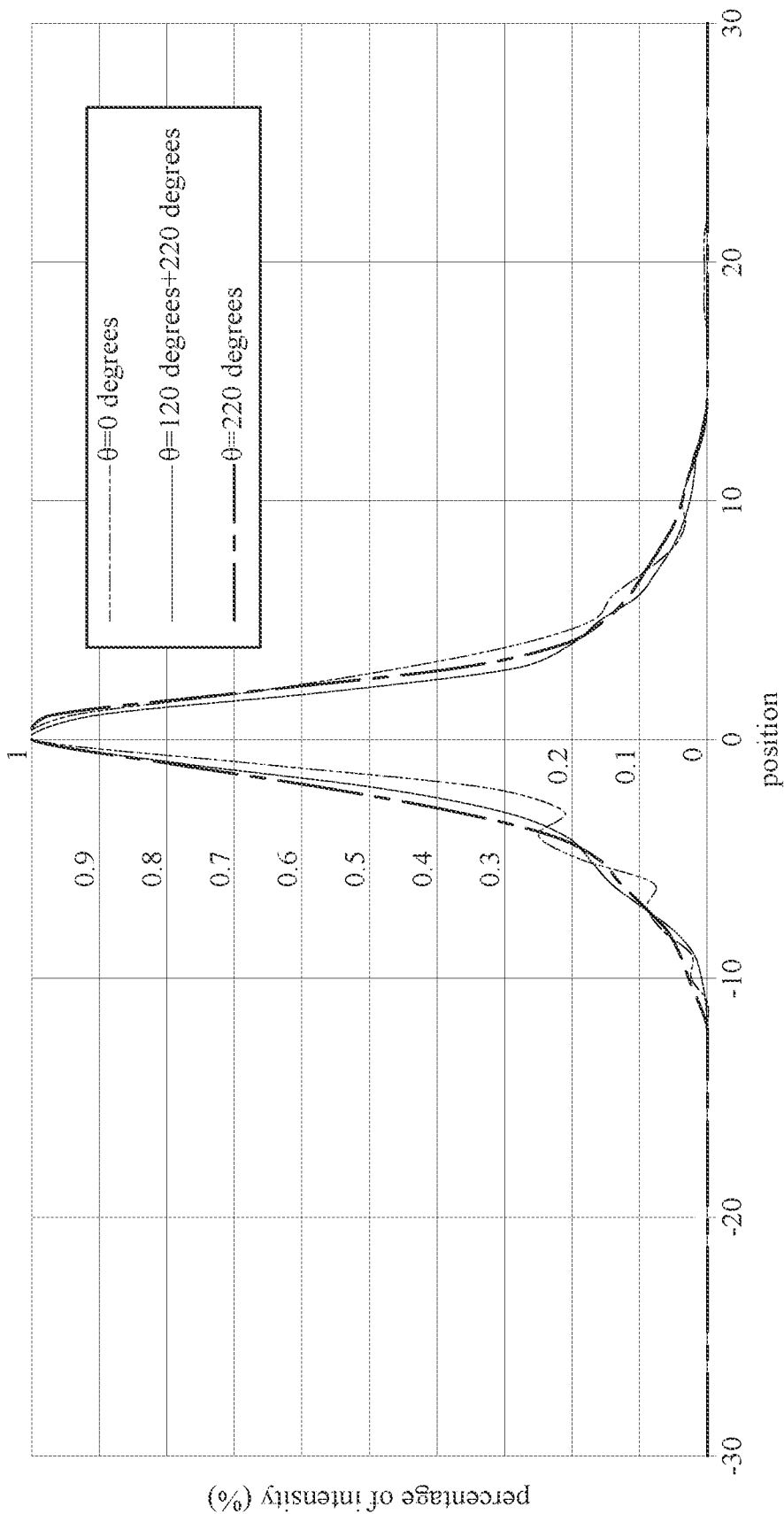
FIG. 10 is a chart showing diffraction intensities caused by light passing through transparent displays according to embodiments of the present disclosure under different curved angles of serpentine parts among wires that surround hexagonal opening areas.

Then, please refer to FIG. 10, which is a chart showing diffraction intensities caused by light passing through transparent displays according to embodiments of the present disclosure under different curved angles of serpentine parts among wires that surround hexagonal opening areas. Please be noted that for simplicity, in FIG. 10, the curved angle of the curved part of the serpentine part is represented by θ. As shown in FIG. 10, when the ratio of the serpentine part maintains the same, the intensities of diffraction caused by light passing through the transparent displays in the case of θ being mixture of 120 degrees and 220 degrees, and 220 degrees are less than that in the case of no serpentine part being provided (e.g., θ=0 degree).

EIGHTH EMBODIMENT

Figure 11:
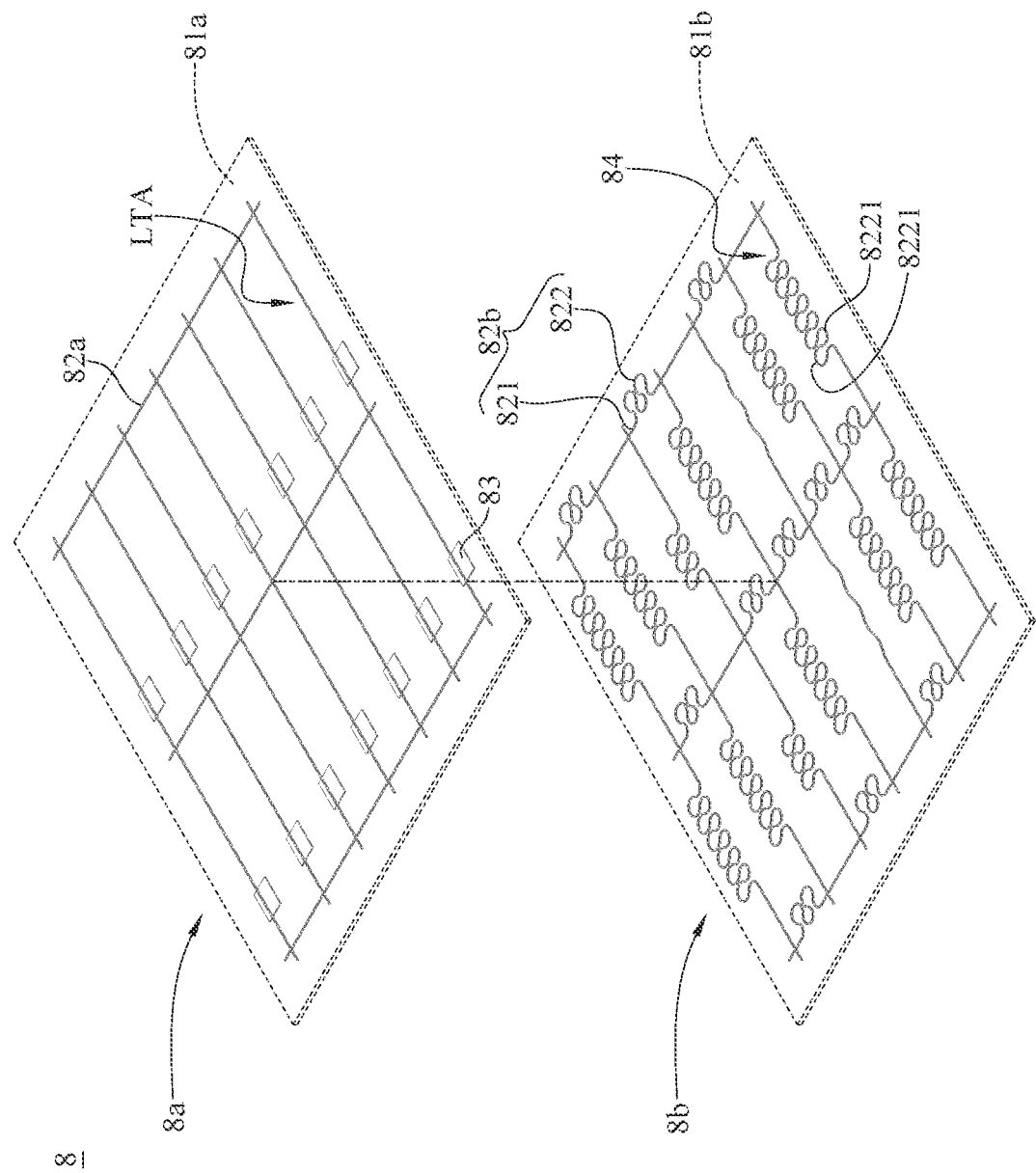
FIG. 11 is an exploded view of a transparent device according to an eighth embodiment of the present disclosure.

Please refer to FIG. 11, which is an exploded view of a transparent device according to an eighth embodiment of the present disclosure.

In this embodiment, a transparent device 8 includes a transparent display 8a and a transparent film 8b.

The transparent display 8a includes a first transparent substrate 81a, a plurality of first wires 82a, and a plurality of electronic components 83. The first wires 82a can have conductivity, and the first wires 82a are disposed on the first transparent substrate 81a. The first wires 82a can surround a plurality of light transmittable areas LTA. The electronic components 83 are disposed on and electrically connected to the first wires 82a.

The transparent film 8b can be attached on the transparent display 8a. The transparent film 8b includes a second transparent substrate 81b and a plurality of second wires 82b. The second wires 82b may not be limited to have conductivity or not, and the second wires 82b are disposed on the second transparent substrate 81b. The second wires 82b include a plurality of connection parts 821 and at least one serpentine part 822 that are connected to each other. In the case that the second wires 82b include a plurality of serpentine parts 822 (as shown in FIG. 11), the serpentine parts 822 are at least partially overlapped with the first wires 82a and located on an edge of the light transmittable areas LTA. It can be considered that the connection parts 821 and the serpentine parts 822 can surround a plurality of opening areas 84, and at least one serpentine part 822 is located on an edge of the opening areas 84. After aligning the opening areas 84 with the light transmittable areas LTA, the transparent film 8b can be attached on the transparent display 8a, such that the serpentine parts 822 are at least partially located on the edge of the light transmittable areas LTA. In one embodiment, the transparent film 8b can be attached on the transparent display 8a via an adhesive, an electrostatic force, or other suitable manners.

The shapes of the opening areas 84 are substantially rectangular, the connection parts 821 are straight lines, and the extending paths of the serpentine parts 822 are substantially along horizontal or vertical straight directions on which the serpentine parts 822 extend in a left-and-right-curved manner. The connection parts 821 and the extending paths of the serpentine parts 822 substantially form the outline of the rectangle. Moreover, the opening areas 84 can be substantially rectangular with a similar shape.

The more detail of the serpentine parts 822 will be illustrated hereinafter. The serpentine parts 822 each have at least one curved part 8221. In the case that the serpentine parts 822 each include a plurality of curved parts (as shown in FIG. 11), the curved angle of each curved part 8221 may range from 40 degrees to 280 degrees. The curved angles of the curved parts 8221 among one serpentine part 822 may be the same.

A ratio of a sum of a length from one end to the other end among each of the serpentine parts 822 along its respective extending path to the total extending length of the first wires 82a surrounding the light transmittable areas LTA is equal to or greater than 10%.

Please be noted that in some other embodiments, the second wires 82b may only include a plurality of serpentine parts 822 that may be disconnected to each other rather than include any connection part, as long as the serpentine parts 822 at least partially overlapped with the first wires 82a and located on the edge of the transmittable areas LTA.

Figure 12:
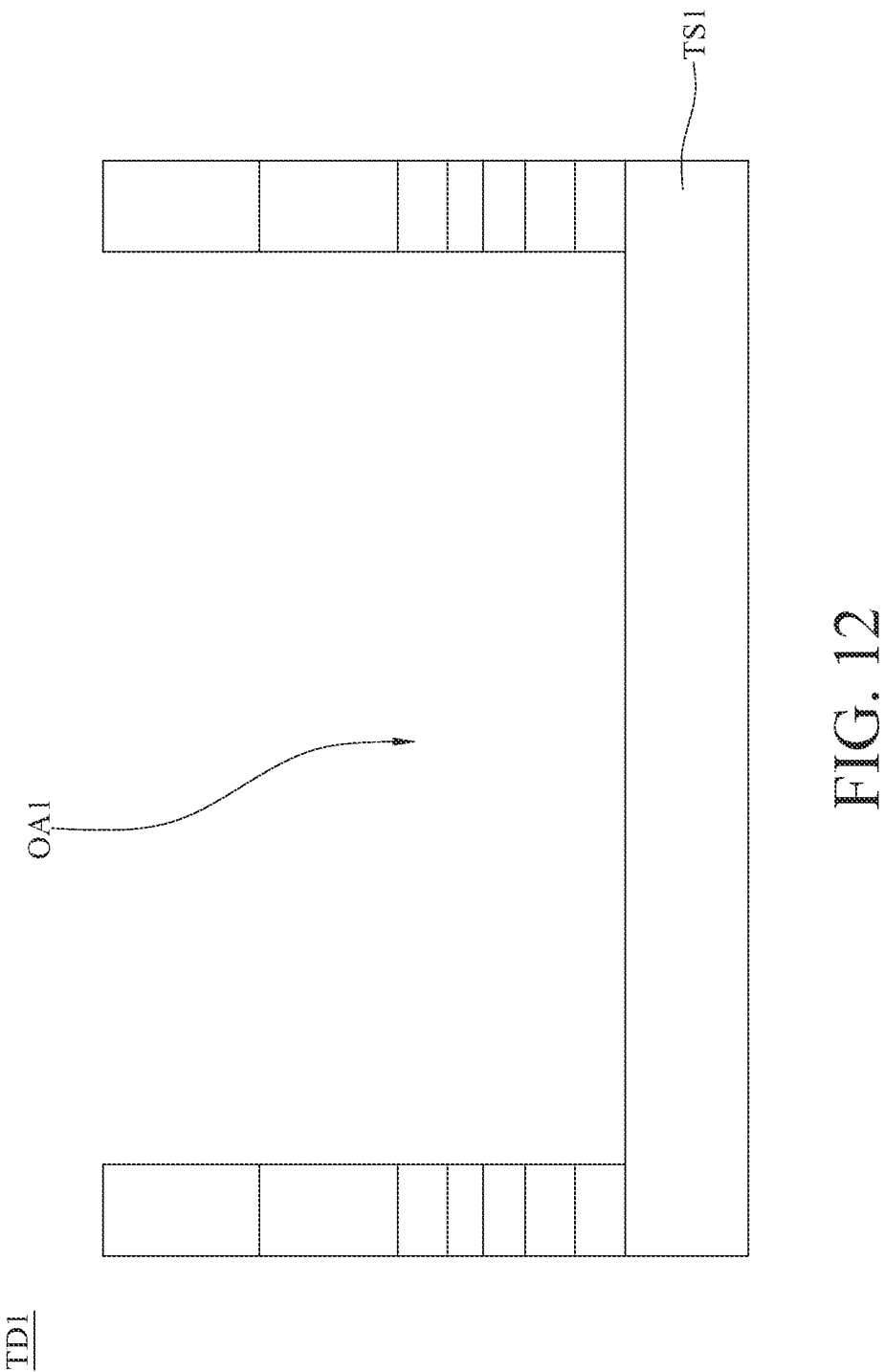
FIG. 12 is a cross-sectional view of a transparent display adjacent to an opening area thereof according to one embodiment of the present disclosure.

Furthermore, the transparent display may only include the transparent substrate in the opening area; that is, there is no any element or film layer disposed on the transparent substrate in the opening area. As such, the yellowing of the panel of the transparent display can be reduced. Please refer to FIG. 12, which is a cross-sectional view of a transparent display TD1 adjacent to an opening area OA1 thereof according to one embodiment of the present disclosure. As shown in FIG. 12, there is no any element or film layer disposed on the transparent substrate TS1 in the opening area OA1.

Figure 13:
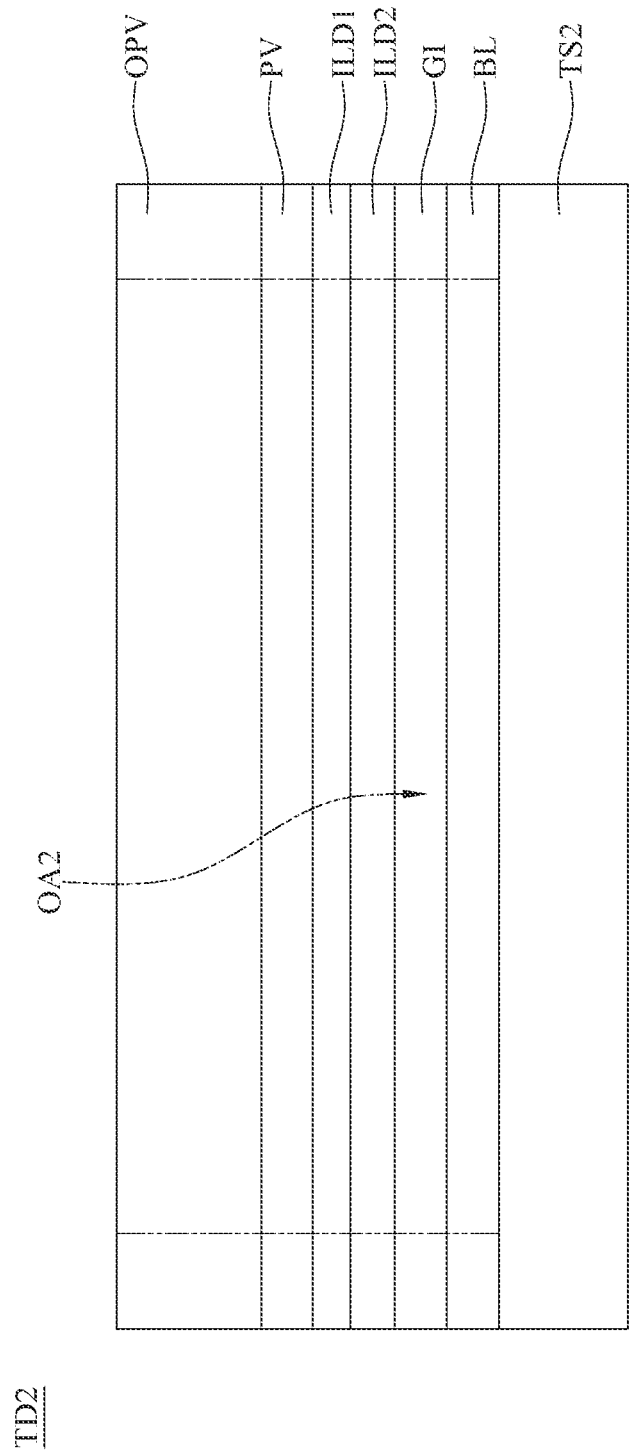
FIG. 13 is a cross-sectional view of a transparent display adjacent to an opening area thereof according to another embodiment of the present disclosure.
Figure 14:
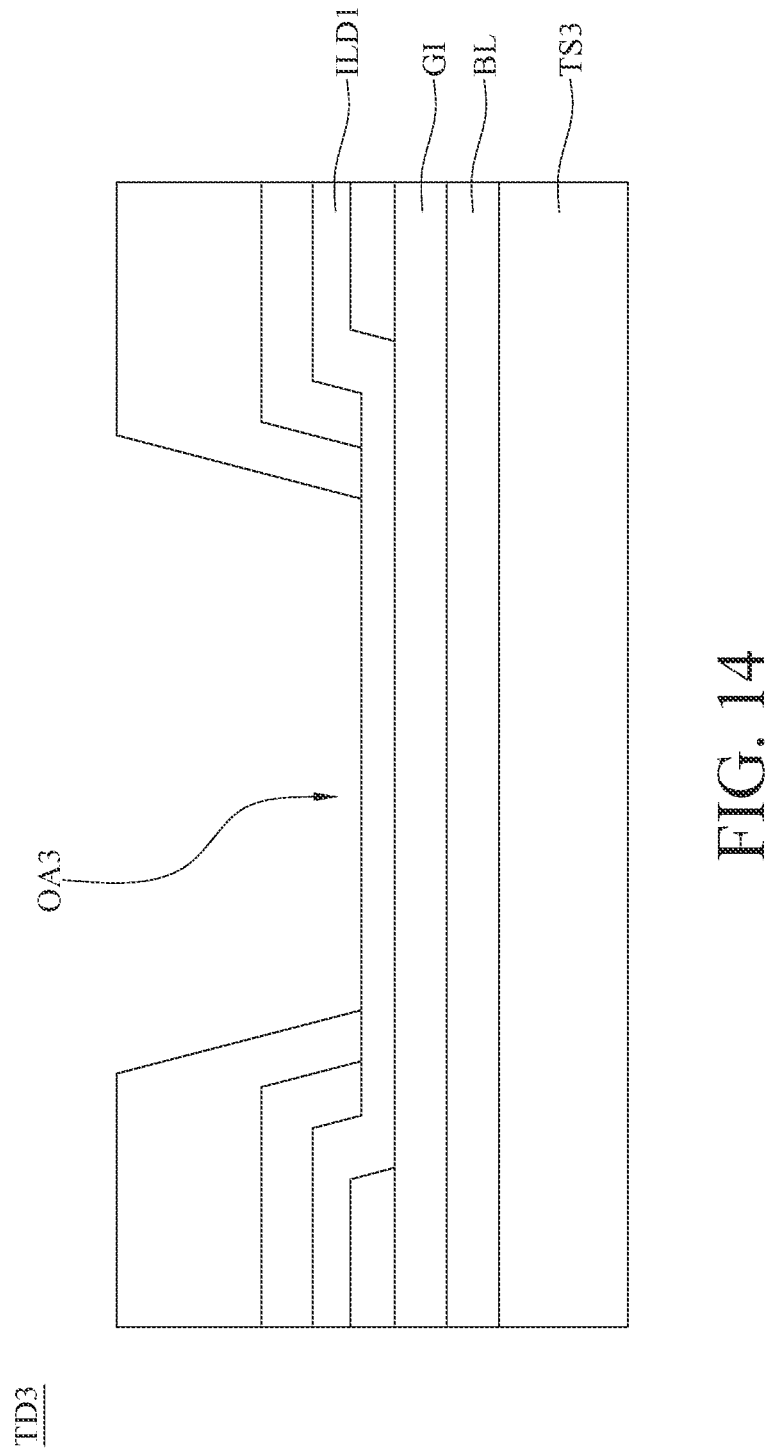
FIG. 14 is a cross-sectional view of a transparent display adjacent to an opening area thereof according to still another embodiment of the present disclosure.

Alternatively, the transparent display may include the transparent substrate and at least one layer stacked on the transparent substrate in the opening area. The at least one layer may be an organic passivation layer, a passivation layer, a first interlayer dielectric layer, a second interlayer dielectric layer, a gate insulator layer, a buffer layer, etc. Please refer to FIG. 13, which is a cross-sectional view of a transparent display TD2 adjacent to an opening area OA2 thereof according to another embodiment of the present disclosure. The opening area OA2 can be defined by the dash-double-dotted imaginary line in FIG. 13. As shown in FIG. 13, an organic passivation layer OPV, a passivation layer PV, a first interlayer dielectric layer IDL1, a second interlayer dielectric layer IDL2, a gate insulator layer GI, and a buffer layer BL are disposed on the transparent substrate TS2 in the opening area OA2. Please refer to FIG. 14, which is a cross-sectional view of a transparent display TD3 adjacent to an opening area OA3 thereof according to still another embodiment of the present disclosure. As shown in FIG. 14, a first interlayer dielectric layer IDL1 a gate insulator layer GI, and a buffer layer BL are disposed on the transparent substrate TS3 in the opening area OA3. The experimental data about yellowing of the transparent display TD2 and the transparent display TD3 are shown in the following table. In the following table, light transmittance under irradiation of light (T) with wavelengths of 450 nanometers (nm), 550 nm and 650 nm is represented by percentage (%), and yellowing index is represented by YI, wherein the greater the value of YI is, the higher the yellowing degree is; the less the value of YI is, the lower the yellowing degree is.

|  | T (450 nm) | T (550 nm) | T (650 nm) | YI |
| --- | --- | --- | --- | --- |
| Transparent display TD2 | 50.4% | 67.3% | 68.8% | 25.4 |
| Transparent display TD3 | 63.1% | 67.0% | 67.1% | 4.82 |

According to the transparent display discussed above, the serpentine part arranged on the edge of the light-transmittable opening areas can lead the opening areas to in fact have different contours. When light passes through the inconsistent opening areas of different contours, diffraction can thus be reduced, such that the image to be presented can be accurately displayed by the transparent display.

According to the transparent film and the transparent device, with the serpentine part of the transparent film, when light passing through the transparent display without any serpentine wire and the transparent film with the serpentine part, diffraction can be reduced, and therefore the image to be presented can be accurately displayed by the transparent display.

The embodiments are chosen and described in order to explain the principles of the present disclosure and its practical applications, to thereby enable others skilled in the art utilize the present disclosure and various embodiments with various modifications as are suited to the particular use being contemplated. It is intended that the scope of the present disclosure is defined by the following claims and their equivalents.

What is claimed is:

1. A transparent display, comprising:
a transparent substrate;
a plurality of wires, disposed on the transparent substrate, wherein the plurality of wires has at least one serpentine part having a first end and a second end that are opposite to each other, and there is an extending path formed from the first end to the second end; and
a plurality of electronic components, disposed on the plurality of wires;
wherein the plurality of wires has at least one part surrounding an opening area and having a total extending length, the at least one part of the plurality of wires comprises the at least one serpentine part, and a ratio of a sum in length of the at least one serpentine part along the extending path to the total extending length is equal to or greater than 10%;
wherein the at least one serpentine part extends from the first end to the second end having a length equal to or greater than 10% of the total extending length and the at least one serpentine part does not have any wire extending perpendicular through the at least one serpentine part.

2. The transparent display according to claim 1, wherein the plurality of electronic components comprises a plurality of light emitting elements, and the at least one serpentine part is located between any two of the plurality of light emitting elements.

3. The transparent display according to claim 1, wherein the at least one serpentine part has at least one curved part that has a curved angle ranging from 40 degrees to 280 degrees.

4. The transparent display according to claim 1, wherein the at least one serpentine part has a plurality of curved parts, and adjacent two of the plurality of curved parts have curvature radii with different signs.

5. The transparent display according to claim 1, wherein a quantity of the at least one serpentine part is plural, each of the serpentine parts has a plurality of curved parts having a same curved angle or different curved angles, and the curved parts of adjacent two of the serpentine parts have different curved angles.

6. The transparent display according to claim 1, wherein a quantity of the at least one serpentine part is plural, and ratios of lengths of adjacent two of the serpentine parts along respective extending paths thereof to the total extending length are different.

7. The transparent display according to claim 1, wherein a quantity of the opening area is plural, and adjacent two of the opening areas have different shapes.

8. The transparent display according to claim 1, wherein the plurality of wires further has a plurality of connection parts connected to the at least one serpentine part,
wherein the plurality of connection parts is formed in arc lines, and a shape of the opening area is substantially circular or oval; or the plurality of connection parts is formed in straight lines, and a shape of the opening area is substantially polygonal.

9. The transparent display according to claim 1, wherein the plurality of wires further has a plurality of connection parts connected to the at least one serpentine part, and the at least one serpentine part substantially extends along an extending direction of one of the plurality of connection parts adjacent thereto.

10. The transparent display according to claim 1, wherein the at least one serpentine part substantially extends along a straight direction.

11. The transparent display according to claim 1, wherein the at least one serpentine part has flexibility.

12. The transparent display according to claim 1, wherein the transparent display only comprises the transparent substrate in the opening area.

13. The transparent display according to claim 1, wherein the transparent display comprises the transparent substrate and at least one layer stacked on the transparent substrate in the opening area.

14. A transparent film, configured to be attached on a transparent display, and the transparent film comprising:
   a transparent substrate; and
   a plurality of wires, disposed on the transparent substrate, wherein the plurality of wires has at least one serpentine part, the plurality of wires has at least one part forming an opening area, and the at least one part of the plurality of wires comprises the at least one serpentine part;
   wherein the opening area is configured to be aligned with a light transmittable area of the transparent display, and the at least one serpentine part is configured to at least partially located on an edge of the light transmittable area;
   wherein the at least one serpentine part has at least one curved part that has a curved angle ranging from 40 degrees to 280 degrees;
   wherein the at least one serpentine part extends from a first end to a second end opposite to the first end and has the curved part with the curved angle ranging from 40 degrees to 280 degrees and the at least one serpentine part does not have any wire extending perpendicular through the at least one serpentine part.

15. The transparent film according to claim 14, wherein a quantity of the curved part of the at least one serpentine part is plural, and adjacent two of the curved parts have curvature radii with different signs.

16. The transparent film according to claim 14, wherein a quantity of the curved part of the at least one serpentine part is plural, a quantity of the at least one serpentine part is plural, the curved parts of each of the serpentine parts have a same curved angle or different curved angles, and the curved parts of adjacent two of the serpentine parts have different curved angles.

17. The transparent film according to claim 14, wherein the plurality of wires further has a plurality of connection parts connected to the at least one serpentine part, and the at least one serpentine part substantially extends along an extending direction of one of the plurality of connection parts adjacent thereto or along a straight direction.

18. The transparent film according to claim 14, wherein the at least one serpentine part has flexibility.

19. A transparent device, comprising:
   a transparent display, comprising:
      a first transparent substrate;
      a plurality of first wires, disposed on the first transparent substrate, wherein the plurality of first wires has at least one part surrounding a light transmittable area and having a total extending length; and
      a plurality of electronic components, disposed on the plurality of first wires; and
   a transparent film, disposed on the transparent display, and the transparent film comprising:
      a second transparent substrate; and
      a plurality of second wires, disposed on the second transparent substrate, wherein the plurality of second wires has at least one serpentine part having a first end and a second end that are opposite to each other, and there is an extending path formed from the first end to the second end, and the at least one serpentine part is at least partially overlapped with the at least one part of the plurality of first wires and located on an edge of the light transmittable area;
   wherein a ratio of a sum in length of the at least one serpentine part along the extending path to the total extending length is equal to or greater than 10%;
   wherein the at least one serpentine part extends from the first end to the second end having a length equal to or greater than 10% of the total extending length and the at least one serpentine part does not have any wire extending perpendicular through the at least one serpentine part.

* * * * *